US005675299A

United States Patent [19]
Suski

[11] Patent Number: 5,675,299
[45] Date of Patent: Oct. 7, 1997

[54] BIDIRECTIONAL NON-SOLID IMPEDANCE CONTROLLED REFERENCE PLANE REQUIRING NO CONDUCTOR TO GRID ALIGNMENT

[75] Inventor: Edward D. Suski, Lake Forest, Calif.

[73] Assignee: AST Research, Inc., Irvine, Calif.

[21] Appl. No.: 620,971

[22] Filed: Mar. 25, 1996

[51] Int. Cl.[6] .................................................. H01P 3/08
[52] U.S. Cl. ................................................ 333/1; 333/238
[58] Field of Search ................................ 333/1, 238, 246; 174/35 R, 36, 102 SP, 113 R, 117 F, 117 FF, 250, 254

[56] References Cited

U.S. PATENT DOCUMENTS

| | | |
|---|---|---|
| 2,721,312 | 10/1955 | Grieg et al. . |
| 3,612,744 | 10/1971 | Thomas ........................... 174/36 |
| 3,634,782 | 1/1972 | Marshall ......................... 333/1 |
| 3,654,381 | 4/1972 | Copp . |
| 3,700,825 | 10/1972 | Taplin et al. ..................... 174/36 |
| 3,914,531 | 10/1975 | Zell et al. . |
| 3,923,364 | 12/1975 | Shapiro et al. . |
| 4,367,585 | 1/1983 | Elliot et al. . |
| 4,408,255 | 10/1983 | Adkins . |
| 4,437,138 | 3/1984 | Nicol . |
| 4,642,592 | 2/1987 | Beeck ............................. 333/246 |
| 4,644,092 | 2/1987 | Gentry ........................... 174/36 |
| 4,644,093 | 2/1987 | Yoshihara et al. . |
| 4,689,262 | 8/1987 | Bloom . |
| 4,695,694 | 9/1987 | Hill et al. . |
| 4,695,810 | 9/1987 | Heckaman et al. ............... 333/1 |
| 4,769,270 | 9/1988 | Nagamatsu et al. . |
| 4,825,090 | 4/1989 | Grabis . |
| 4,845,313 | 7/1989 | Endoh et al. . |
| 4,855,537 | 8/1989 | Nakai et al. . |
| 4,857,119 | 8/1989 | Karst et al. . |
| 4,871,883 | 10/1989 | Guiol ............................. 174/36 |
| 4,885,431 | 12/1989 | Kawakami et al. . |
| 4,973,799 | 11/1990 | Soma et al. . |
| 4,978,812 | 12/1990 | Akeyoshi et al. . |
| 5,012,041 | 4/1991 | Sims et al. . |
| 5,014,593 | 5/1991 | Auyer et al. . |
| 5,110,651 | 5/1992 | Massard et al. . |
| 5,112,648 | 5/1992 | Okonogi et al. . |
| 5,177,324 | 1/1993 | Carr et al. . |
| 5,195,243 | 3/1993 | Junod . |
| 5,202,688 | 4/1993 | Hubbard et al. . |
| 5,235,132 | 8/1993 | Ainsworth et al. . |
| 5,236,736 | 8/1993 | Kawakami et al. . |
| 5,293,004 | 3/1994 | Kawakami et al. . |
| 5,296,651 | 3/1994 | Gurrie et al. . |
| 5,300,899 | 4/1994 | Suski ............................. 333/1 |
| 5,334,800 | 8/1994 | Kenney ......................... 333/1 X |
| 5,479,138 | 12/1995 | Kuroda et al. ................... 333/1 |

FOREIGN PATENT DOCUMENTS 267913  10/1993  Japan .................................. 333/238

OTHER PUBLICATIONS

Cross–Hatched Ground Plane, *IBM Technical Disclosure Bulletin*, vol. 33, No. 4, Sep. 1990, pp. 155–156.
Drawing of Parlex cable BNR NT4K1232 having 12 mil lines on mil centers (Sep. 30, 1992).
Drawing of Parlex cable BNR NT4K1232 having 10 mil lines on 20 mil centers (Sep. 30, 1992).
Drawing of Parlex cable BNR NT4K1234 having 12 mil lines on 25 mil centers (Sep. 30, 1992).

(List continued on next page.)

*Primary Examiner*—Paul Gensler
*Attorney, Agent, or Firm*—Knobbe, Martens, Olson & Bear, L.L.P.

[57] ABSTRACT

A circuit board includes a plurality of signal conductors and a grid. The grid has a pattern of conductive material which forms cell structures oriented along a first axis. The grid pattern is configured so that when the signal conductors are oriented parallel to a first axis they overlay a substantially constant area of the conductive material regardless of where the signal conductors are positioned. The capacitance of the signal conductors is thereby controlled so that the impedances of the signal conductors can be maintained at a high level.

18 Claims, 15 Drawing Sheets

OTHER PUBLICATIONS

Copies of four layers of M–flex cable (1982–1983).
Drawing of Parlex microstrip cable.
Enlarged drawing of portion of Parlex microstrip cable.

Photocopy of Mektec flexible cable.
Photocopy of of Sheldahl flexible cable.
Photocppy of M–Flex flexible cable.

BIDIRECTIONAL NON-SOLID IMPEDANCE CONTROLLED REFERENCE PLANE REQUIRING NO CONDUCTOR TO GRID ALIGNMENT

BACKGROUND OF THE INVENTION

1. Field of Invention

The present invention relates generally to flexible cable and printed circuit board transmission lines, and, more particularly, to an apparatus and method for controlling the impedances of signal lines in flexible cables and printed circuit boards.

2. Description of the Related Art

The present invention relates to the controlling of impedance of data transmission lines or other types of transmission lines in flat flexible cables and in printed circuit boards which have multiple conductors proximate to ground reference planes.

Microstrips and striplines are extensively used to interconnect high-speed logic circuits in digital computers because they can be fabricated by automated techniques and can provide impedance-controlled signal paths. However, microstrip construction permits significant levels of extraneous electromagnetic radiation. Stripline construction can be utilized to greatly reduce unwanted electromagnetic radiation. However, the addition of a second reference or ground layer results in increased capacitive coupling between the signal conductor and the reference planes, thus greatly reducing the impedance of the signal conductor. In order to maintain a desired higher impedance, the distance between reference layers and the signal conductor in traditional stripline construction must be greater than in microstrip construction. This increased thickness significantly reduces the ability of the cable to withstand multiple flexures, or, when used in a printed circuit board, increases the overall thickness of the printed circuit board.

Typically, conductors are formed in planes in a flexible cable or a printed circuit board. Ground planes or other reference voltage planes are positioned in planes parallel to the conductor planes to control the impedance of the signal conductors and to block the transmission of electromagnetic radiation from conductors carrying high frequency signals, such as clock signals and high speed data signals found in digital computers. In printed circuit boards, and the like, solid ground planes are generally used. However, solid ground planes are inflexible unless made very thin, and thus cannot be readily used to protect signal conductors in cables that are intended to be frequently flexed, such as, for instance, signal conductors in a flexible cable between the base and the movable display screen of a notebook computer. Furthermore, because of the large capacitance of a solid ground plane formed close to a signal conductor, the impedance of the signal conductor may be lower than desired. On the other hand, if the ground plane is spaced further apart from the signal conductors to reduce the capacitance and thereby increase the impedance, a flexible cable becomes thicker and thus less flexible and more likely to break with repeated flexing. Similarly, a printed circuit board becomes thicker and thus more heavy and more costly to build.

Reference planes having conductive elements formed in a grid have been utilized in microstrip designs to increase the impedance and to provide flexibility. However, because the grid is not continuous like a solid reference plane, it has been found to be quite difficult to control the impedance of signal conductors protected by a gridded reference plane because of the lack of control of the area of the conductive grid elements traversed by the signal conductors, and hence because of a lack of control of the capacitance of the signal conductors with respect to the shielding grid. It is thus a goal of the present invention to provide a flexible cable and a circuit board which provide effective shielding and which have a controllable characteristic impedance.

Traditionally, the impedance of microstrip and stripline construction was determined by the signal conductor width, the separation of the signal conductor from one or more reference planes, the dielectric that surrounds the signal conductor, and, to a lesser degree, the thickness of the signal conductor.

However, such traditional methods of determining impedances in striplines and microstrips impose too many constraints on the designer. For example, in certain applications, such as the interconnection of peripheral components in the latest desktop and server systems, very high impedances on printed circuit boards are required. One way of obtaining such high impedances using existing technology is to increase the separation between the signal conductor and the reference plane. However, this requires the use of expensive printed circuit boards of nonstandard thickness. Such nonstandard printed circuit boards are not only expensive to implement, but also undesirable in many applications due to their bulk. It is thus a goal of the present invention to provide a circuit board which provides high impedance without increasing the thickness of the circuit board.

Alternatively, the microstrip designer may choose to increase signal conductor impedance by increasing the separation of the signal conductor from the reference plane and reducing the width of the signal conductor. However, two limitations restrict the designer in the implementation of the latter procedure. First, the minimum width of signal conductors is limited by present technology to approximately 4 mils (1 mil=0.0001 inch). Secondly, the cost of fabricating a circuit board increases significantly when conductor widths fall below 6 mils.

Another disadvantage associated with traditional microstrip construction is the generation of both forward and reverse crosstalk, which can seriously impair signal quality. Crosstalk is the effect of coupling the signal of one channel into another. Crosstalk may arise from a number of sources, one of which is the unbalance of cable parameters. In particular, crosstalk may arise from the unbalance between the capacitance and inductance of conductors. Due to this unbalance, net coupling of the signal of one conductor into another can result. Such unbalance is generally aggravated when a conductor is exposed to nonhomogeneous media, as is the case with traditional microstrip construction. It is thus another goal of the present invention to provide a circuit board that exhibits reduced crosstalk while providing increased impedance.

In addition to the above limitations, surface conductors in traditional microstrip construction radiate high levels of electromagnetic radiation which interfere with the functioning of surrounding electronics. Conversely, extraneous radiation may also affect the operation of surface conductors. In traditional microstrip construction, it was not possible to provide adequate shielding because the surface of the signal conductor was free to radiate into the cavity of the system enclosing the circuit board. Containment of such radiation required that the signal conductor be constructed using stripline construction. However, high impedance conductors of stripline construction require that the separation between reference planes and conductors be increased drastically to reach the desired high impedance. However, an increase in thickness would be undesirable in applications where thin circuit boards or standard thickness circuit boards are required. It is therefore another goal of the present invention to provide a circuit board that provides effective shielding while providing increased impedance.

The limitations of traditional approaches for increasing and controlling the range of impedances for flexible cable and printed circuit board transmission lines have been addressed in U.S. Pat. No. 5,300,899 issued to Edward D. Suski and assigned to AST Research, Inc. The contents of U.S. Pat. No. 5,300,899, in its entirety, is hereby incorporated by reference. The technique described in U.S. Pat. No. 5,300,899 utilizes substantially identical first and second conductive shielding grids, where the second conductive grid is positioned at a predetermined offset with respect to the first grid, and where conductive lines are positioned between the grids at predetermined locations with respect to the grids. By using conductive shielding grids, as opposed to solid conductive planes, it is possible to make reference planes with greater flexibility. Additionally, the capacitance between a conductive line and a reference grid is less than the capacitance between a conductive line and a solid reference plane. Furthermore, by positioning the conductive lines at predetermined locations with respect the grid, with each conductive line spaced a constant predetermined distance from an adjacent conductive line, it is possible to assure that the capacitance, and hence the impedance, with respect to the shielding grids is controlled.

However, the technique described in U.S. Pat. No. 5,300,899 positions the conductive lines at predetermined positions with respect to the grid, and also spaces each conductive line a predetermined distance from adjacent conductive lines. These conditions impose conditions on the positions of the conductive lines and thus make routing more difficult. Also, the number of lines which can be routed in a given area is limited.

Accordingly, there is a need in the art to provide a flexible cable having flexible reference planes, capable of thousands of flexures in a stripline design, and achieving a desired impedance which permits transfer of the signals without requiring the predetermined positioning of the signal conductors, and without degradation to the signal quality, while providing an acceptable shielding capability.

There is also a need in the art to provide a circuit board with increased signal line impedances without increasing circuit board thickness, or decreasing conductor width or conductor thickness or without using either nonhomogeneous or nonstandard dielectric material to achieve the desired increased impedance to permit the transfer of signals without degradation of the signal quality or loss of signal density, and without requiring that the signal conductor be positioned at predetermined locations, while providing an acceptable shielding capability.

SUMMARY OF THE INVENTION

The present invention is an apparatus and method for increasing the range of impedances of signal conductors in a flexible cable or printed circuit board which includes a plurality of such signal conductors. The cable or circuit board also includes a grid having a pattern comprising a conductive material. The grid pattern is configured so that the signal conductors are oriented parallel to a first axis. The signal conductors overlay a substantially constant area of the conductive material regardless of where the signal conductors are positioned.

One aspect of the present invention is a circuit board (or cable) having a first axis. The circuit board further comprises a first grid having a first pattern comprising a first cell structure. The circuit board also includes a second grid substantially parallel to the first grid, and having a second cell structure aligned at a predetermined offset with respect to the cell structure of the first grid. The second grid has a second pattern comprising a second cell structure. The first and second cells are configured so that a signal conductor disposed between the first grid and the second grid, and oriented parallel to the first axis, will have a substantially constant capacitance, regardless of where the signal conductor is positioned. In a preferred embodiment, the second pattern is substantially the same as the first pattern, and the second cell structure is substantially the same as the first cell structure.

In a particularly advantageous embodiment, a shielding system comprises a first conductive grid in a first plane. The first conductive grid has a first axis and a second axis. The second axis is perpendicular to the first axis in the first plane. A signal conductor is disposed in a second plane substantially parallel to the first plane. The signal conductor is positioned in parallel to one of the first and second axes. The signal conductor has a substantially constant capacitance with respect to the first conductive grid regardless of where the signal conductor is located in the second plane. In a preferred embodiment, the shielding system also includes a second conductive grid substantially parallel to the first conductive grid, with the signal conductor disposed between the first conductive grid and the second conductive grid. The areas of the first and the second conductive grids are varied to produce a constant capacitance relative to the signal conductor.

Another aspect of the present invention is a circuit board which comprises a grid of conductive material having a first axis. The circuit board also includes a signal conductor disposed at a relatively constant distance from the grid. The signal conductor traverses a substantially constant area of the conductive material regardless of where the conductor is positioned.

Yet another aspect of the present invention is a circuit board which comprises a grid of conductive material having a first axis. The grid also has a second axis perpendicular to the first axis. The circuit board further comprises a signal conductor positioned parallel to the first axis. The signal conductor has a substantially constant capacitance relative to the grid, regardless of where the signal conductor is positioned along the second axis. In a preferred embodiment, the circuit board further comprises a second grid of conductive material aligned at a predetermined offset from the first grid in a first axis. The second grid is also positioned at a predetermined offset from the first grid along a third axis. The third axis is orthogonal to the first and the second axis. The conductive signal is disposed between the first and the second grids. The area of the conductive material of the first grid and an area of the conductive material of the second grid are reduced where the first grid and the second grid overlap in the third axis to produce a substantially constant impedance in the signal conductor.

Another aspect of the present invention is a method of increasing the impedance of a signal conductor in a circuit board, comprising the step of positioning a first patterned shielding grid having a first axis on one side of a signal conductor. The patterned shielding grid comprises a plurality of intersections of conductive elements. The method further comprises the step of positioning the signal conductor so that it is parallel to the first axis. The method further comprises the steps of configuring the conductive elements and configuring the intersections so that an average capacitance formed with the signal conductor remains substantially constant regardless of the positioning of the signal conductor along the second axis. In a preferred embodiment the method further comprises the steps of positioning a second patterned shielding grid on an opposite side of the signal conductor, the second grid being offset from the first grid along the first axis. The method further comprises the steps of configuring the first grid and configuring the second grid so that the capacitance remains relatively constant.

In yet another embodiment of the present invention is a circuit board having a first axis. The circuit board further comprises a first signal conductor and a second signal conductor. The first and second signal conductors are oriented parallel to the first axis. The circuit board also includes a first set of conductive elements disposed in a first plane at a distance from the first and second signal conductors. A second set of conductive elements are disposed in the first plane perpendicular to the first set of conductive elements. The first set of conductive elements and the second set of conductive elements form a repeating patterns of cells. Each of the cells have a first and second vertex. The first vertex is diagonally opposed to the second vertex. A fillet is disposed within the first vertex and a filet is disposed within the second vertex so that each of the signal conductors overlay a substantially constant area of the conductive elements and fillets. In a preferred embodiment each of the cells have a third and a fourth vertex. A fillet is disposed within the third vertex and a fillet is disposed within the fourth vertex. In yet another preferred embodiment of the present invention, the circuit board also includes a third signal conductor oriented perpendicular to the first axis.

DETAILED DESCRIPTION OF THE PREFERRED EMBODIMENT

Figure 1:
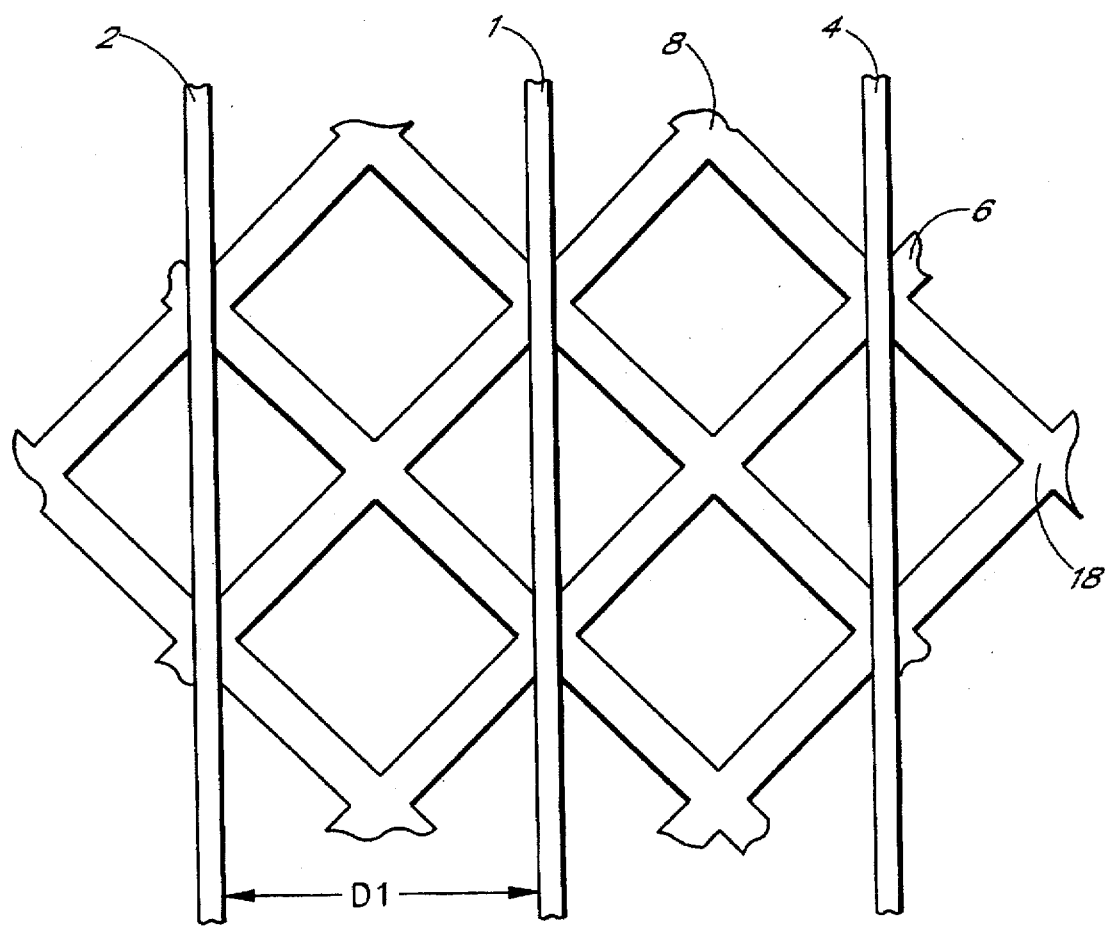
FIG. 1 depicts a plan view of a prior art gridded reference plane.

FIG. 1 illustrates a prior art gridded reference plane system as described in U.S. Pat. No. 5,300,899. By using conductive shielding grids, as opposed to solid conductive planes, it is possible to make reference planes with greater flexibility. Additionally, as discussed below, the capacitance between a conductive line and a solid reference grid will be less than the capacitance between a conductive line and a reference plane.

The reference grid system described in U.S. Pat. No. 5,300,899 comprises a shielding grid 18 which further comprises a set of electrically conductive elements 6, 8, and a plurality of signal conductors 1, 2, 4, all of which are aligned in predetermined locations with respect to one another as will be described below.

As illustrated in FIG. 1, the shielding grid 18 has a repeating pattern of squares formed by the electrically conductive elements 6, 8 that form the grid 18. As illustrated, the elements 6 of the grid 18 are perpendicular to the elements 8.

As discussed below, the capacitance of a signal conductor 1, 2, 4 will be affected by the conductive area of the adjacent shield 18 as the signal conductors 1, 2, 4 traverses the grid 18. In particular, for reasons set forth below, the squares are oriented at 45 degrees with respect to the principle orientation of the signal conductors 1, 2, 4 such that the electrically conductive elements 6, 8 appear as cross-hatching with respect to the signal conductors 1, 2, 4.

Each of the grid squares has four vertices formed by the intersection of two of the electrically conductive elements 6, 8. As further illustrated in FIG. 1, the signal conductors 1, 2, 4 are preferably positioned so that the signal conductors 1, 2, 4 extend from vertex to vertex of the squares defined by the conductive elements of the grid 18. With the signal conductors 1, 2, 4 positioned in this manner, the signal conductors 1, 2, 4 pass over a vertex of the grid 18 and each signal conductor overlays the same area of the conductive material of the grid.

The relationship between the capacitance and the area of the conductive material overlaid by the signal conductor is illustrated by the equation:

$$C = \frac{\epsilon_0 \epsilon_r a}{h} \quad (1)$$

where:

$\epsilon_0$ is the permittivity of free space;

$\epsilon_r$ is the dielectric constant of the material between the conductor and the reference plane;

h is the separation between the signal conductor and reference plane; and a is the area of the grid's conductive material overlaid by the signal conductor.

Thus, as illustrated in FIG. 1, each of the signal conductors 1, 2, 4 overlays substantially the same area of conductive material for every cell they traverse. With reference to Equations (1) the capacitive coupling of the signal conductors 1, 2, 4 will be substantially the same as long as they are offset from each other by a whole multiple of the dimension D1 and thereby will each overlay the same area of the conductive material of the grid 18.

With reference to Equation (2), the impedance of the signal conductors 1, 2, 4 is a function of capacitance, inductance, resistance and conductance as follows:

$$Z_0 = \sqrt{\frac{R + j\omega L}{G + j\omega C}} \quad (2)$$

where $Z_0$ is the characteristic impedance of the signal conductors, R is the resistance, G is the conductance, $\omega$ is the frequency in radians (i.e., $2\pi f$), j is the squareroot(−1), L is the inductance and C is the capacitance of the signal conductors.

At high frequencies, the impedance is primarily determined by the capacitance and the inductance, and Equation (2) reduces to:

$$Z_0 = \sqrt{\frac{L}{C}} \quad (3)$$

Thus, by reducing the capacitive coupling of the conductor to the reference plane, the value of C in the denominator of Equation (3) is reduced and the characteristic impedance is increased (i.e., the impedance is inversely proportional to the capacitance per unit length of the conductor). This has the equivalent effect of moving the reference plane further away from the conductor which increases the characteristic impedance of the signal conductors. Therefore, by reducing the capacitance of the signal conductors 1, 2, 4 by using a grid reference plane instead of a solid reference plane, and by holding the average capacitance substantially constant, the impedance of the signal conductors can be accurately and consistently maintained with sufficiently high impedance to match the characteristic impedance of other circuit paths in an electronics system, such as a notebook computer or the like. For example, it is often desirable to provide a characteristic impedance of 50 ohms, an impedance frequently used in high frequency clock circuits.

Figure 2:
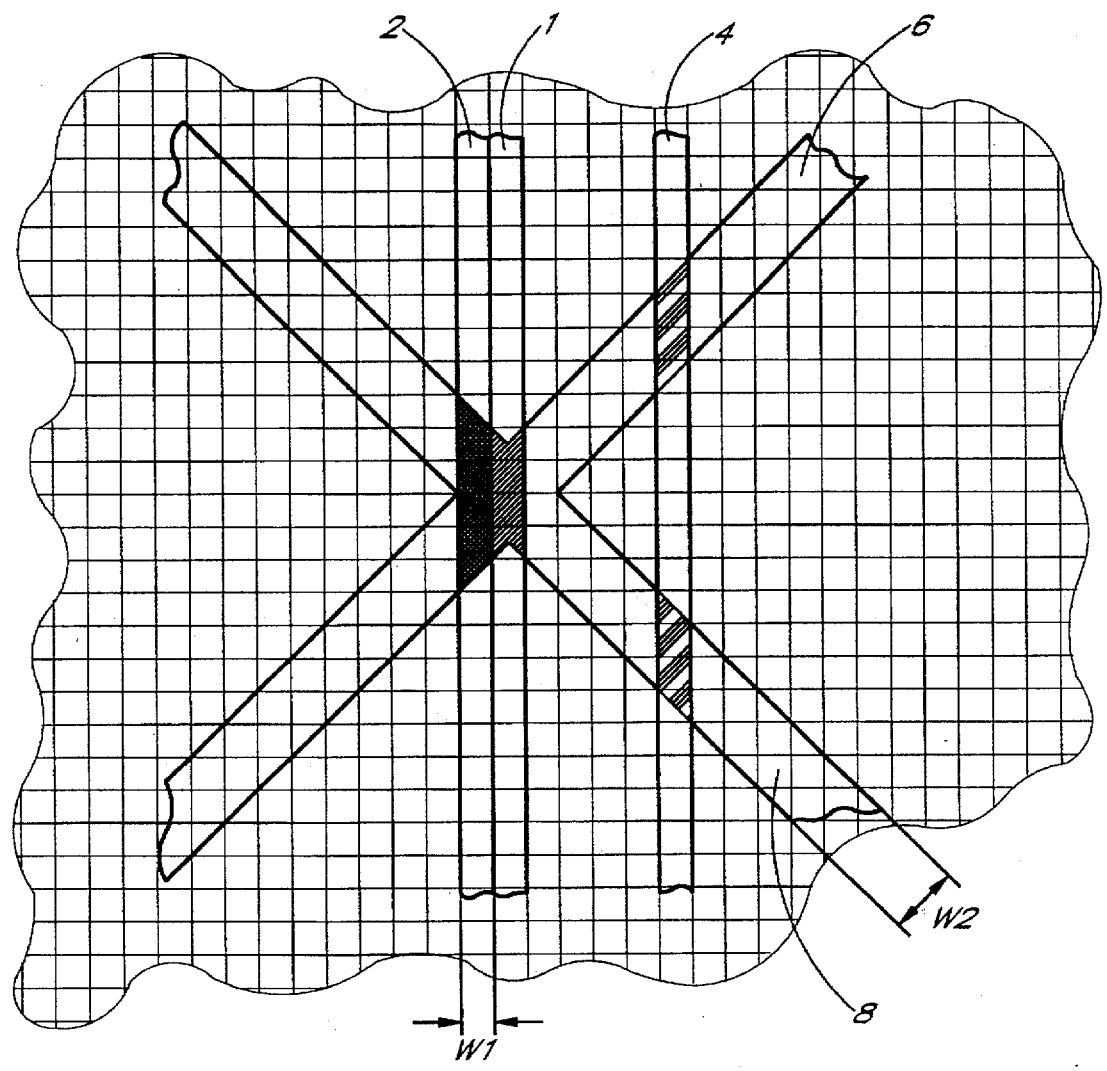
FIG. 2 depicts a plan view of the prior art gridded reference plane where signal conductors are spaced at different intervals.

If, however, the signal conductors 1, 2, 4 are not offset from each other by a whole multiple of the dimension D1, but instead the signal conductors 1, 2, 4 are placed at a random spacing from each other as illustrated in FIG. 2, the signal conductors 1, 2, 4 will not overlay the same area of the conductive material of the grid 2. Thus, by way of example, if the signal conductors 1, 2, 4 have a width W1 which is 1 unit wide, and if the conductive elements 6, 8 each have a width W2 which is approximately 2.1 units wide, then the signal conductor 1 overlays 3.5 unit areas, the signal conductor 2 overlays 5 unit areas, and signal conductor 4, overlays 6 unit areas. Thus, with reference to Equation 1, the relative capacitive coupling of the signal conductors 1, 2, 4 with respect to the grid 18, for the signal conductors 1, 2, 4 will vary from 3.5 for the signal conductor 1, to 5 for the signal conductor 2, and to 6 for signal conductor 4. Thus the worst case variation of capacitance is approximately 71% from the signal conductor 1 to the signal conductor 6. The percentage variation in capacitance may be different for different widths of the signal conductors 1, 2, 4 and different widths of the conductive elements 6, 8. Since the impedance of a signal line is inversely proportional to the square root of the capacitance, as illustrated by Equation (3), the impedance of the signal conductors 1, 2, 4 will vary by approximately a maximum of 31%, neglecting any changes in inductance, from the signal conductor 1 to the signal conductor 4. Thus while the invention described in U.S. Pat. No. 5,300,899 increases line impedance using a non-solid reference plane, the U.S. Pat. No. 5,300,899 requires relatively constant signal conductor-to-signal conductor alignment to maintain a constant impedance for the signal lines. That is, as illustrated in FIG. 1, all the signal conductors are aligned with the intersections of the grids. Alternatively, as described in U.S. Pat. No. 5,300,899, the signal conductors may be positioned at like predetermined offsets from the intersections. Thus, this approach limits the signal plane area available for routing purposes, thereby reducing the routing density and making routing more difficult.

Figure 4:
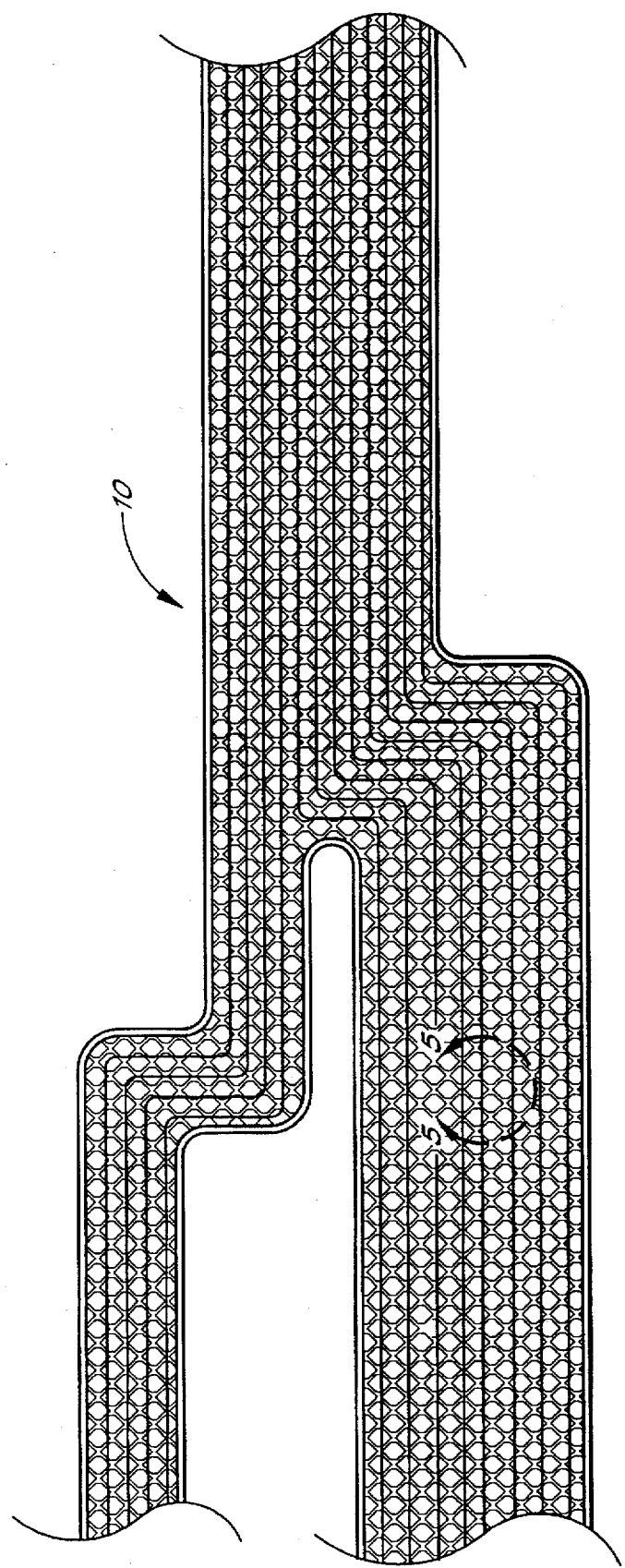
FIG. 4 depicts a plan view of a first embodiment of a shielded flexible cable in accordance with the present invention.
Figure 5:
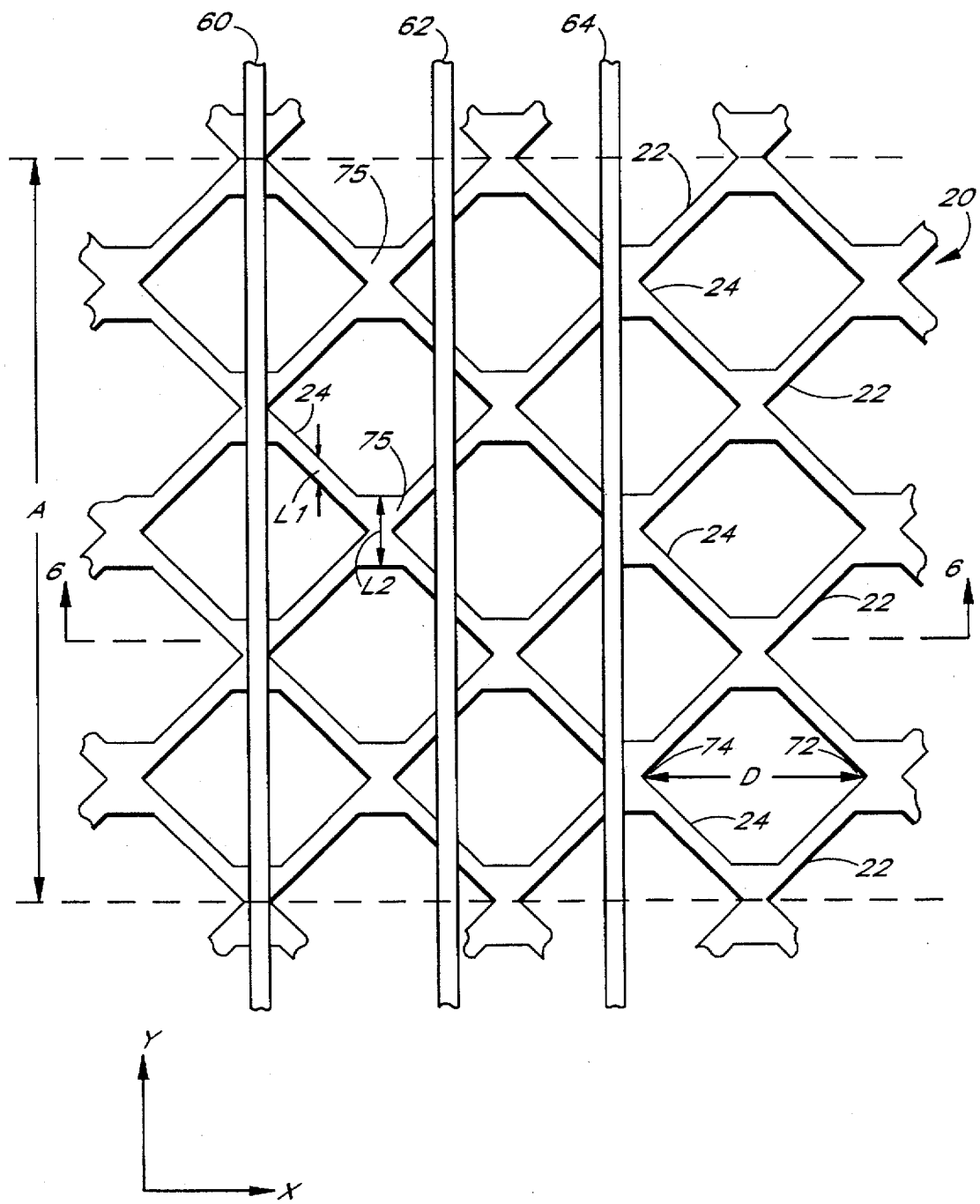
FIG. 5 depicts an enlarged view of a section 5—5 in FIG. 4.

FIGS. 4 and 5 depict a circuit board 10 in accordance with the present invention. As illustrated in FIG. 5, the circuit board comprises a conductive shielding grid 20 comprising a set of electrically conductive elements, and a plurality of signal conductors 60, 62, 64.

Figure 3A:
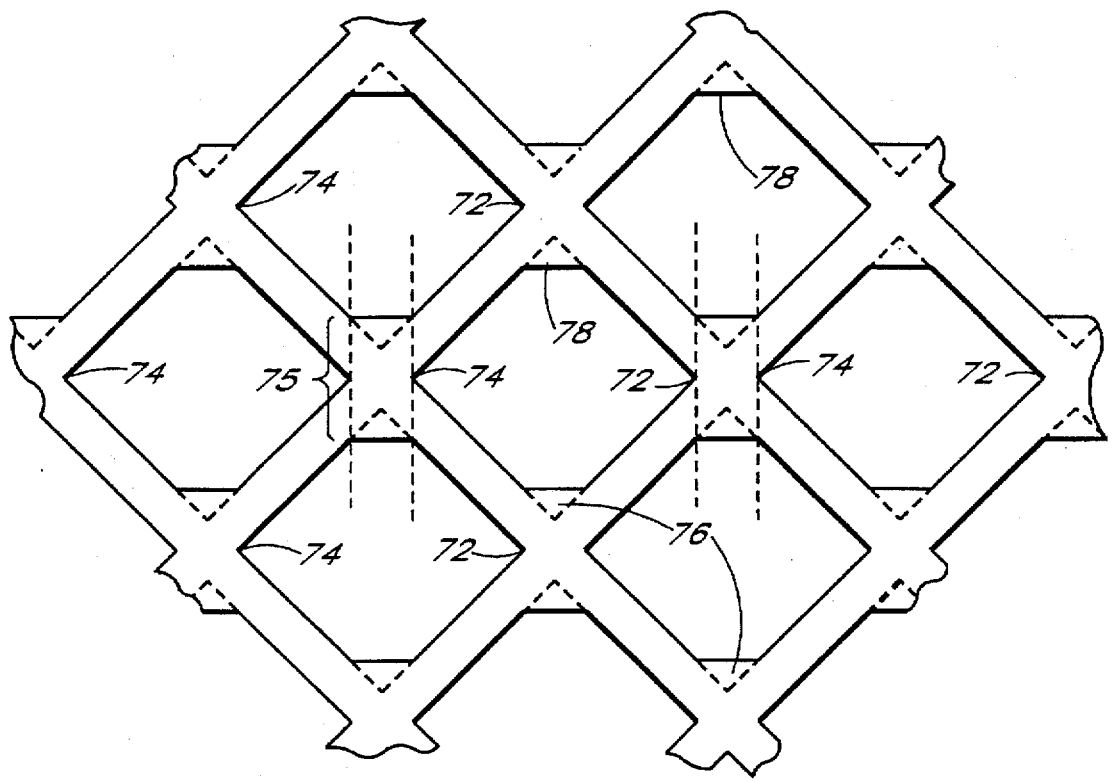
FIG. 3a depicts a first preferred embodiment of a cell structure in accordance with the present invention.

The shielding grid 20 has a repeating pattern of cell structures formed by electrically conductive elements 22, 24. As illustrated in FIG. 3a, the cell structure in one version of the preferred embodiment of the present invention is formed by adding a fillet to opposite vertices of two of the four vertices, 76, 78 of each of the square cells used in the prior art gridded reference plane 18 to form shaped intersections 75 of the conductive elements 22, 24. The resulting cell structures are eye-shaped and have first and second corners 72, 74. With reference to FIG. 5, in the preferred embodiment of the present invention the conductive elements 22 are perpendicular to the conductive elements 24. In one preferred embodiment of the invention, the shaped intersections 75 of the conductive elements 22, 24 are oppositely disposed from each other across the eye-shaped structure and are separated at the corners 72, 74 by a distance D. The shaped intersections 75 are positioned between vertically adjacent cell structures when oriented as shown in FIG. 5. It is understood that the cell configuration illustrated in FIGS. 3a, 5 is shown by way of example, and that numerous other suitable configurations may be used.

Preferably, the grid 20 is formed by printed circuit board etching techniques by removing copper or other conductive material from a printed circuit board blank such that the conductive material remaining after etching forms the conductive elements 22, 24.

The distance D between the first corner 72 and the second corner 74 forms the greatest opening between any two conductive elements and is called the slot size. As is well known in the art of shielding electrical signals, an effective barrier to the emission of electromagnetic energy from the signal conductors 60, 62, 64 is formed if the slot size is less than one-half the wavelength of the highest signal frequency propagating in any of the signal conductors 60, 62, 64. It should be understood that signals, such as clock signals, having a frequency of 100 Mhz, by way of example, will have harmonics of many times that frequency. The harmonics of the highest signal frequency are considered when determining the maximum allowable distance between the grid elements of the shielding grid 20. In the preferred embodiment, the distance D is selected to be less than 1/20 the size of the shortest expected wavelength of any signal traveling through the signal conductors 60, 62, 64, to ensure sufficient shielding. For example, if the highest harmonic of concern has a frequency of 2 GHz (corresponding to a wavelength of 0.15 meters), then the maximum desired distance D is 0.75 cm.

Figure 6:
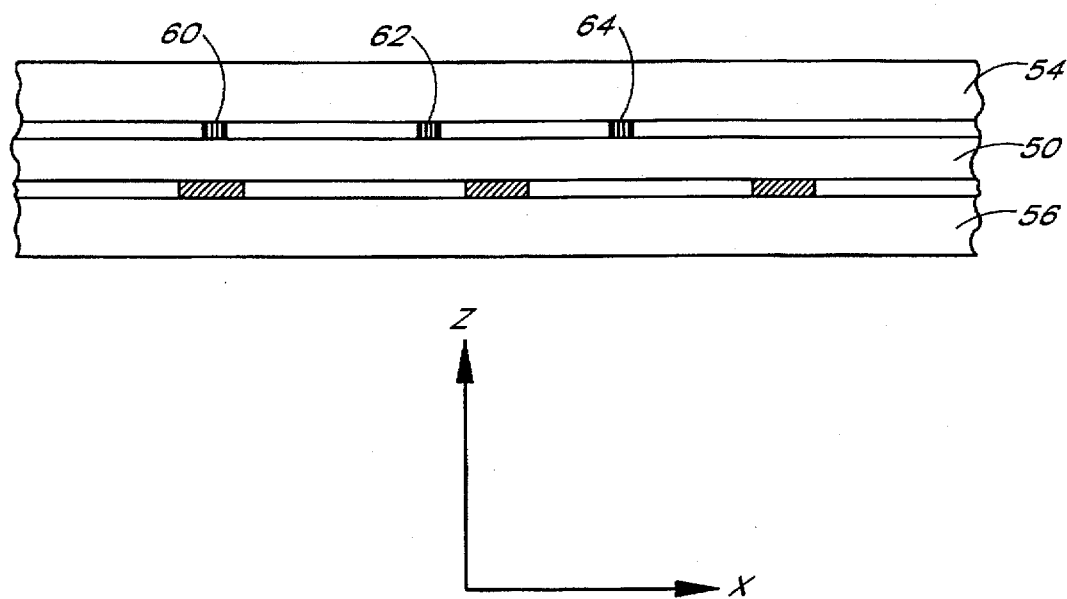
FIG. 6 depicts a cross-sectional elevational view of the present invention taken along the lines 6—6 in FIG. 5.

As illustrated in FIG. 6, the signal conductors 60, 62, 64 are oriented parallel to the grid 20 at a substantially constant distance from the grid 20, and the signal conductors 60, 62, 64 are electrically insulated from the grid 20 by an insulator 50. The bottom surface of the grid 20 is laminated with an insulator 56. In the case of buried microstrip, the upper surfaces of the signal conductors 60, 62, 64 are laminated with an insulator 54. The layers are sandwiched together and held in place by suitable adhesives known to the art.

In order to more fully understand the following description, it is helpful to establish an X, Y, Z coordinate system for the drawing figures. The X and Y axes lie in a horizontal plane as shown in FIG. 5. The grid 20 is in a plane parallel to the horizontal plane. Similarly, the signal conductors 60, 62, 64 lie in a plane parallel to the plane of the grid 20. The principal orientations of the signal conductors 60, 62, 64 are parallel to the Y axis, as illustrated in FIG. 5. The Z axis is perpendicular to the X and Y axes as shown in FIG. 6.

As further illustrated in FIG. 5, a dimension L2, between a first end of the shaped intersection 75 and a second end of the shaped intersection 75, is twice a dimension L1, across conductive element 24 in the direction of the Y-axis. Thus, the signal conductors 60, 62, 64 overlay substantially the same area of conductive material which comprises the grid 20. In a distance A, the signal conductor 60 transverses the equivalent of three intersections (the signal conductor 60 transverses two complete intersections and two half intersections), the signal conductor 62 transverses six conductive elements, and the signal conductor 64 transverses portions of both the same number of intersections as the signal conductor 60, and portions of the same number of conductive elements as the signal conductor 64. Hence, regardless of where a signal conductor is positioned in the X axis, it will overlay substantially the same area of the conductive material which comprises the grid 20.

Thus, as illustrated by Equation (1), the capacitance "C" of a signal conductor is proportional to the area "a" which is the area of the conductive material of the grid which is overlaid by the conductor. Therefore, the capacitance "C" will decrease proportionally to a decrease in "a." When using a conductive reference grid in accordance with the current invention, the area of conductive material overlaying and parallel to a signal conductor is less than the area of conductive material overlaying and parallel to a signal conductor in a system which uses a solid conductive reference plane. Thus, the capacitance of a signal conductor in the present invention will be lower than the capacitance in a traditional system. Furthermore, since the capacitance of the signal conductors 60, 62, 64 relative to the conductive grid 20 is proportional to the area of the conductive material the conductors overlay, the signal conductors 60, 62, 64 have substantially the same average capacitance formed with the conductive grid 20 even though there is no constant grid-to-conductor alignment or no constant signal conductor-to-signal conductor alignment in the X axis.

The impedances of the signal conductors 60, 62, 64 are functions of capacitance, inductance, resistance and conductance as defined in Equation (2). The variation in inductance of the signal conductors 60, 62, 64 is not significant, and may be ignored for the following description. With reference to Equation (3), by configuring the cells so that the variations in average capacitance of the signal conductors 60, 62, 64 in relation to the grid 20 are minimized, the impedance of the signal conductors 60, 62, 64 will likewise be minimized. The minimal variations in the impedance of the signal conductors 60, 62, 64 in the present invention compares favorably to those achieved in the previously illustrated prior art using a simple cross-hatched grid pattern with no set positioning of conductor with respect to a grid, where the area traversed by a first conductor may vary by as much as 71% from the area traversed by a second, parallel, conductor. In this prior art implementation, it will be evident from Equation (1) and Equation (3) that the capacitance of the first conductor compared to the capacitance of the second conductor may likewise vary by as much as 71%. Hence the impedance, which is proportional to the square root of the inverse of the capacitance, may vary by as much as 31%, neglecting any changes in inductance.

As discussed above, the present invention overcomes the limitations and drawbacks associated with traditional methods of raising and controlling impedances, such as increasing the distance between a signal conductor and a reference plane. The traditional method has the adverse effects of increasing the thickness, weight, and cost of the board.

Another traditional technique for increasing the impedance of a signal conductor is to decrease the width or thickness of a signal conductor to decrease the area of a reference plane overlaid by the signal conductor and thereby to reduce the capacitive coupling between the signal conductor and the reference plane. This approach also has undesirable consequences, because the thinner signal conductors may be difficult to manufacture and may have limited current-carrying capabilities.

Yet another traditional approach for increasing impedances is to use insulators with lower dielectric constants between a signal conductor and a reference plane. However, non-standard insulators with lower dielectric constants are significantly more costly than standard dielectrics. Thus, the use of lower dielectric constant insulators results in a more expensive circuit board. The present invention has the advantage of providing higher controlled impedances without added thickness, weight or cost.

Another approach to increasing line impedance uses a non-solid reference plane with signal conductor-to-grid alignment. However this approach has the limitation of restricting the signal plane area available for routing purposes, thereby reducing the routing density, and making routing more difficult.

Thus, the invention described above provides a printed circuit board shielding system which supports high density routing of microstrip lines, while providing for controlled, consistent, high impedances, without the necessity of controlling relative grid-to-grid alignment or relative signal conductor-to-signal conductor alignment, and without incurring the penalties associated with traditional approaches for increasing impedances.

There also exists a need in the art to provide a printed circuit board or a cable with controlled, increased impedances for stripline signal conductors, without resorting to one of the traditional methods with their aforementioned attendant drawbacks, and without the need for conductor-to-grid alignment or signal conductor-to-signal conductor alignment. These goals are met by a preferred embodiment of the invention discussed below.

Figure 7:
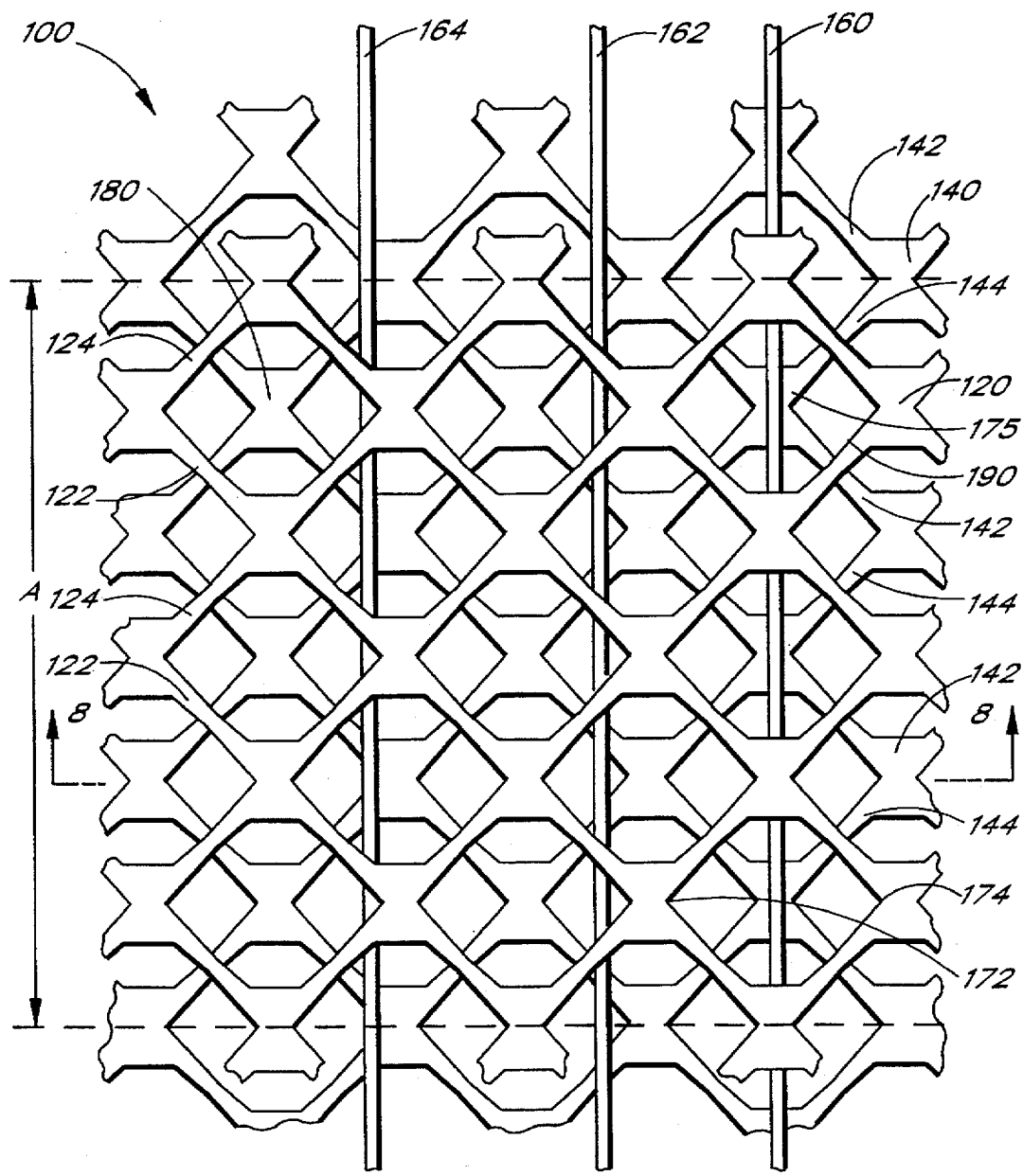
FIG. 7 depicts a plan view of a second preferred embodiment of circuit board transmission lines in accordance with the present invention.

FIG. 7 illustrates a three layer centered stripline circuit board configuration of the present invention. The circuit board 100 comprises an upper shielding grid 120 comprising a set of electrically conductive elements, a lower shielding grid 140 comprising a like set of electrically conductive elements, and a plurality of signal conductors, 160, 162, 164.

As illustrated in FIG. 7, each of the shielding grids 120, 140 has a uniform, repeating pattern of cell structures. The cell structures are formed by electrically conductive elements 122, 124 and 142, 144, respectively. In the preferred embodiment, the conductive elements 122 are perpendicular to the conductive elements 124, and the elements 142 are perpendicular to the elements 144. In one preferred embodiment of the invention, a shaped intersection 175 is formed at the intersection of the conductive elements 122, 124, or 142, 144, such that the cell structure formed by the conductive elements 122, 124 or 142, 144, is eye-shaped and has first and second corners 172, 174.

Figure 8:
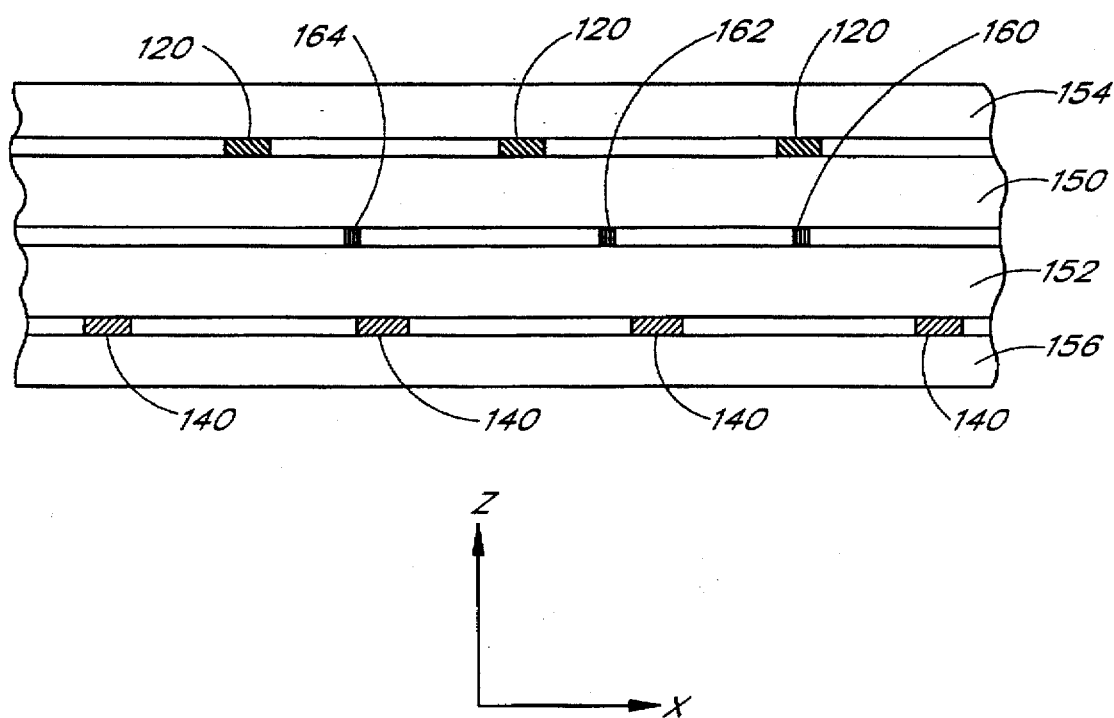
FIG. 8 depicts a cross-sectional elevational view of the present invention taken along the lines 8—8 in FIG. 7.

As illustrated in FIG. 8, the signal conductors 160, 162, 164 are positioned between and are oriented parallel to the grids 120, 140. The signal conductors 160, 162, 164 are electrically insulated from the upper grid 120 by an insulator 150, and are insulated from the lower grid 140 by an insulator 152. The upper surface of the upper grid 120 is laminated with an insulator 154, and the bottom surface of the lower grid 140 is laminated with an insulator 156.

In order to more fully understand the following description, it is helpful to again establish an X, Y, Z coordinate system for the drawing figures. The X and Y axes lie in a horizontal plane as shown in FIG. 7. Each of the grids 120, 140 is in a plane parallel to the horizontal plane. Similarly, the signal conductors 160, 162, 164 lie in a plane between and parallel to the planes of the two grids 120, 140. The principal orientations of the signal conductors 160, 162, 164 are parallel to the Y axis, as illustrated in FIG. 7. The Z axis is perpendicular to the X and Y axes as shown in FIG. 8.

Referring to FIGS. 7 and 8, the upper grid 120 and lower grid 140 are offset with respect to each other so that the waists of the intersections 175 of one grid are centered in the eye-shaped cells 190 of the other grid. Although the offset may be such that the waists are not centered, centering the waist provides the optimum control of the impedance in the present invention. In particular, it can be seen that the area of conductive material of the upper grid 120 which overlays the lower grid 140 is minimized, thereby minimizing the capacitance between the two grids 120, 140, and between the grids 120, 140 and the signal conductors 160, 162 164 disposed between the grids 120, 140. Hence, the grids 120, 140 are preferably offset so that there is no overlap of grid intersections 180 and so that there is only a minimal overlap of grid conductive elements 122, 142 and grid conductive elements 124, 144.

As further illustrated in FIG. 7, the dimensions of the shaped intersections 175 and the conductive elements 122, 124, 142, 144 of the two grids 120, 140 are selected so that the signal conductors 160, 162, 164 all have substantially the same average capacitance relative to the grids 120, 140 regardless of the positioning of the signal conductors in the X-axis. This is achieved by tapering the conductive elements 122, 124, 142, 144 so that the conductive elements 122, 124, 142, 144 are narrowest at their midpoints between intersections 175. As used herein, the term "mid-point" of a conductive element 122, 124, 142, 144 is a portion of the respective element approximately equidistant from adjacent intersections. It can be seen the upper grid 120 and the lower grid 140 overlap at their respective midpoints. The overlap causes a one-third reduction in the impedance of the signal conductors passing between the overlap compared to the impedance of signal conductors in an embedded microstrip implementation. This reduction in impedance is compensated by necking down the conductive elements 122, 124, 142, 144 so that the total area of the conductive elements 122, 124, 142, 144 between intersections 175 is reduced by approximately one-third thereby restoring the impedance. Thus, the signal conductors 160, 162, 164 have substantially the same capacitance in relationship with the grids 120, 140. In a distance A, the signal conductor 160 transverses three of the intersections, the signal conductor 162 is disposed between six overlaps of the conductive elements 122, 142 or 124, 144, and the signal conductor 164 transverses portions of three intersections 175, and portions of six conductive elements 122, 124, 142, or 144. Hence, regardless of where a signal conductor is positioned in the X axis, it will have substantially the same capacitive coupling with respect to the grids 120, 140.

As illustrated in Equation (2), the impedances of the signal conductors 160, 162, 164 are functions of capacitance, inductance, resistance and conductance. Thus, by reducing the capacitance to the signal conductors 160, 162, 164 in a consistent manner, the impedances of the signal conductors 160, 162, 164 can be accurately and consistently maintained sufficiently high to match the characteristic impedances of other circuit paths in an electronic system, such as in a notebook computer or the like. Thus, the invention described above provides a printed circuit board shielding system which supports high density routing of stripline signal conductors, while providing for controlled, consistent, high impedances, without the necessity of controlling relative signal conductor-to-grid alignment, without the necessity of controlling relative signal conductor-to-signal conductor alignment, and without incurring the penalties associated with traditional approaches for increasing impedances.

The invention discussed above and depicted in FIGS. 7–8 provides a flexible flat cable or a circuit board having flexible reference planes, capable of thousands of flexures in a stripline design, and achieves a desired impedance that permits transfer of the signals without degradation to the signal quality while providing an acceptable shielding capability. This design is based on a pair of symmetrical, shifted reference planes with stripline conductors disposed between the grids. It is particularly useful in applications where a thin flexible circuit, of approximately 5 mils, is required.

There also exists a need in the art to provide a circuit board having multiple signal layers with increased controlled impedances, without resorting to traditional methods with their aforementioned attendant drawbacks. Such goals can be met by the preferred embodiment of the invention discussed below.

Figure 9:
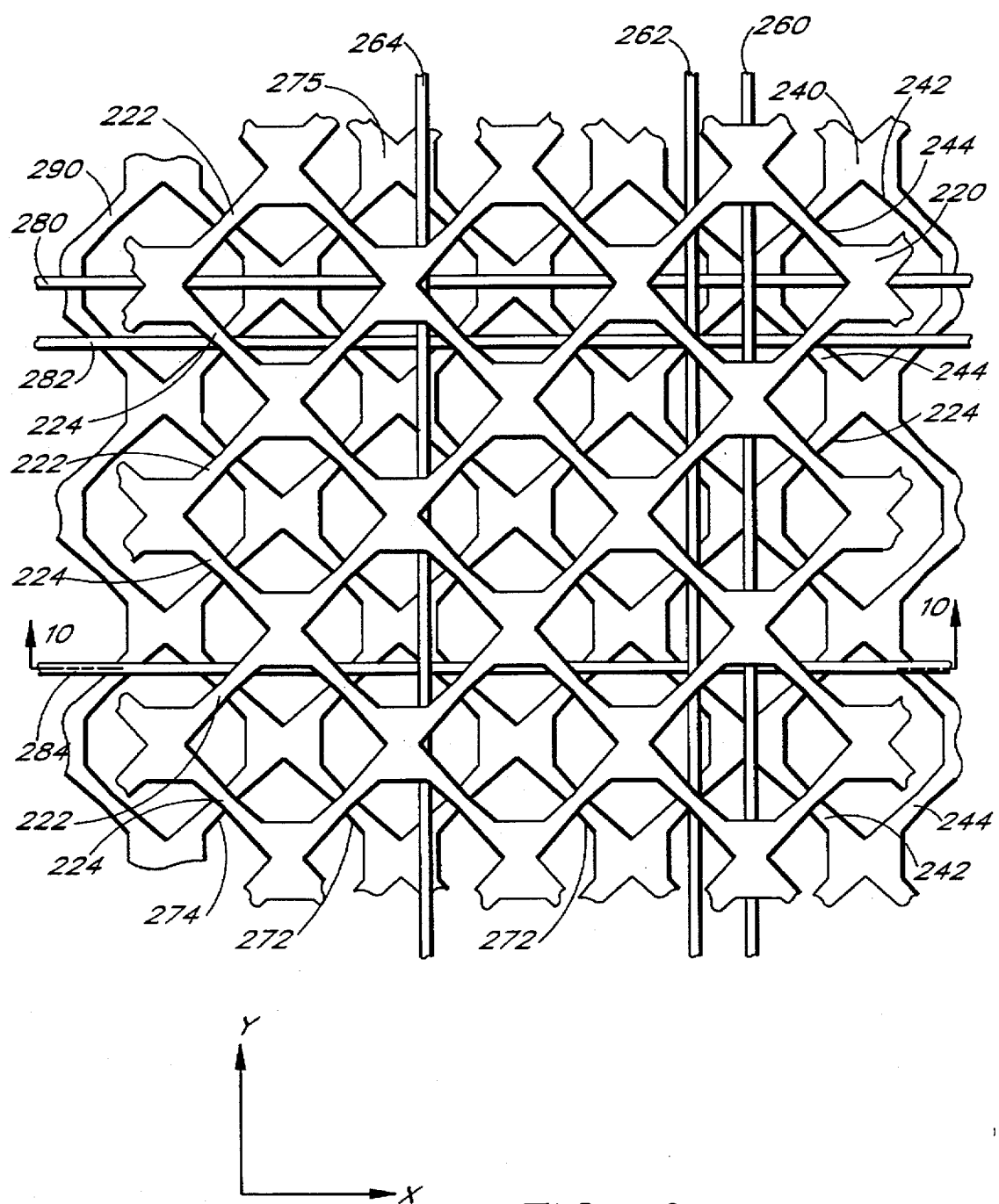
FIG. 9 depicts a plan view of a third preferred embodiment of circuit board transmission lines in accordance with the present invention.

FIG. 9 depicts a plan view of a preferred embodiment of a four layer non-centered stripline implementation of the present invention. As illustrated in FIG. 9, the circuit board 200 comprises a first conductive shielding grid 220, a first plurality of signal conductors 260, 262, 264, a second plurality of signal conductors 280, 282, 284, and a second conductive shielding grid 240.

As illustrated in FIG. 9, each of the shielding grids 220, 240 has a repeating pattern of cell structures. The cell structures are formed by electrically conductive elements 222, 224 and 242, 244, respectively. In the preferred embodiment, the conductive elements 222 are perpendicular to the conductive elements 224 and the elements 242 are perpendicular to the elements 244. In one preferred embodiment of the invention, a shaped intersection 275 is formed at the intersection of the conductive elements 222, 224, or at the intersection of the conductive elements 242, 244. The cell structures formed by the conductive elements 222, 224 and 242, 244 are eye-shaped and have first and second corners 272, 274.

Figure 10:
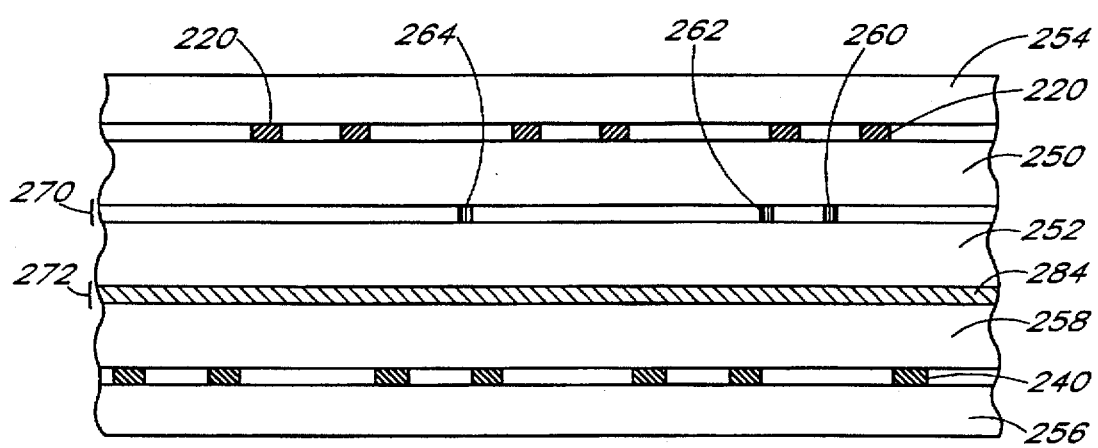
FIG. 10 depicts a cross sectional elevational view of the plan view of the present invention taken along lines 10—10 in FIG. 9.
Figure 10:
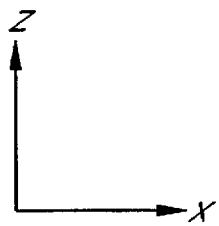

As illustrated in FIG. 10, the signal conductors 260, 262, 264 form a first signal layer 270, and are positioned between and are oriented parallel to the grids 220, 240. The signal conductors 260, 262, 264 are closer to the upper grid 220. Similarly, the signal conductors 280, 282, 284 form a second signal layer 272, and are positioned between and oriented parallel to the grids 220, 240. The signal conductors 280, 282, 284 are closer to the lower grid 240. The signal conductors 260, 262, 264 are electrically insulated from the upper grid 220 by an insulator 250, and are electrically insulated from the signal conductors 280, 282, 284 by an insulator 252. The signal conductors 280, 282, 284 are electrically insulated from the lower grid 240 by an insulator 258. The top surface of the upper grid 220 is laminated with an insulator 254, and the bottom surface of the lower grid 240 is laminated with an insulator 256.

In order to more fully understand the following description, it is again helpful to establish an X, Y, Z coordinate system for the drawing figures. The X and Y axes lie in a horizontal plane as shown in FIG. 9. Each of the grids 220, 240 are in planes parallel to the horizontal plane. The lower grid 240 is rotated in the X-Y plane by 90° with respect to the upper grid 220. The signal conductors 260, 262, 264 lie in a plane between and parallel to the planes of the two grids 220, 240. The signal conductors 260, 262, 264 are positioned closer to the upper grid 220. Similarly, the signal conductors 280, 282, 284 lie in a plane between and parallel to the planes of the two grids 220, 240. The signal conductors 260, 262, 264 are positioned closer to the lower grid 240. The principal orientations of the signal conductors 260, 262, 264 are parallel to the Y axis, while the principal orientation of the signal conductors 280, 282, 284 are parallel to the X axis, as illustrated in FIG. 9. The Z axis is perpendicular to the X and Y axes as shown in FIG. 10.

Referring to FIGS. 9 and 10, the two grids 220, 240 are offset and are rotated with respect to each other so that the waists of the intersections 275 of the grid 240 are perpendicular to the waists of the intersections 275 of the grid 220. The waist of the intersections of the grid 240 are centered in the X-axis and Y-axis of the eye-shaped cells 290 of the grid 220. Although the offset may be such that the waist is not centered, centering the waist provides the optimum control of the impedance in the present invention. In particular, it can be seen that the area of the conductive material of the upper grid 220 which overlays the conductive material of the lower grid 240 is minimized, thereby minimizing the capacitance between the two grids 220, 240, and minimizing the capacitance between the grids 220, 240 and the signal conductors 260, 262 264 disposed between the grids 220, 240. Hence, the grids 220, 240 are offset so that there is no overlap of grid intersections 275 and so that there is only a minimal overlap of grid conductive elements 222, 242 and grid conductive elements 224, 244. The signal conductors 280, 282, 284 are oriented perpendicular to the signal conductors 260, 262, 264 to minimize crosstalk between the two signal layers.

With reference to Equation (1), the capacitance is inversely proportional to the separation between the signal conductor and the reference plane. Thus, as will be appreciated by one skilled in the art, when the signal plane 270 is half the distance in the Z axis from the upper grid 220 than the lower grid 240, the capacitive coupling of the signal conductors 260, 262, 264 relative to the lower grid 240 is minimal compared to the capacitive coupling of the signal conductors 260, 262, 264 to the closer upper grid 220. Similarly, when the distance of the signal plane 272 in the Z axis from the lower grid 240 is half the distance of the signal plane in the Z axis from the upper grid 220, the capacitive coupling of the signal conductors 280, 282, 284 relative to the upper grid 220 is minimal compared to the capacitive coupling of the signal conductors 280, 282, 284 relative to the lower grid 240. Thus, the above-described embodiment provides for two layers of controlled high impedance signal conductors with reduced crosstalk between the signal layers 270, 272. The above-described embodiment is given by way of example, and it will be understood by one skilled in the art that the present invention may be used with more than two signal layers and/or more than two reference planes.

Figure 11:
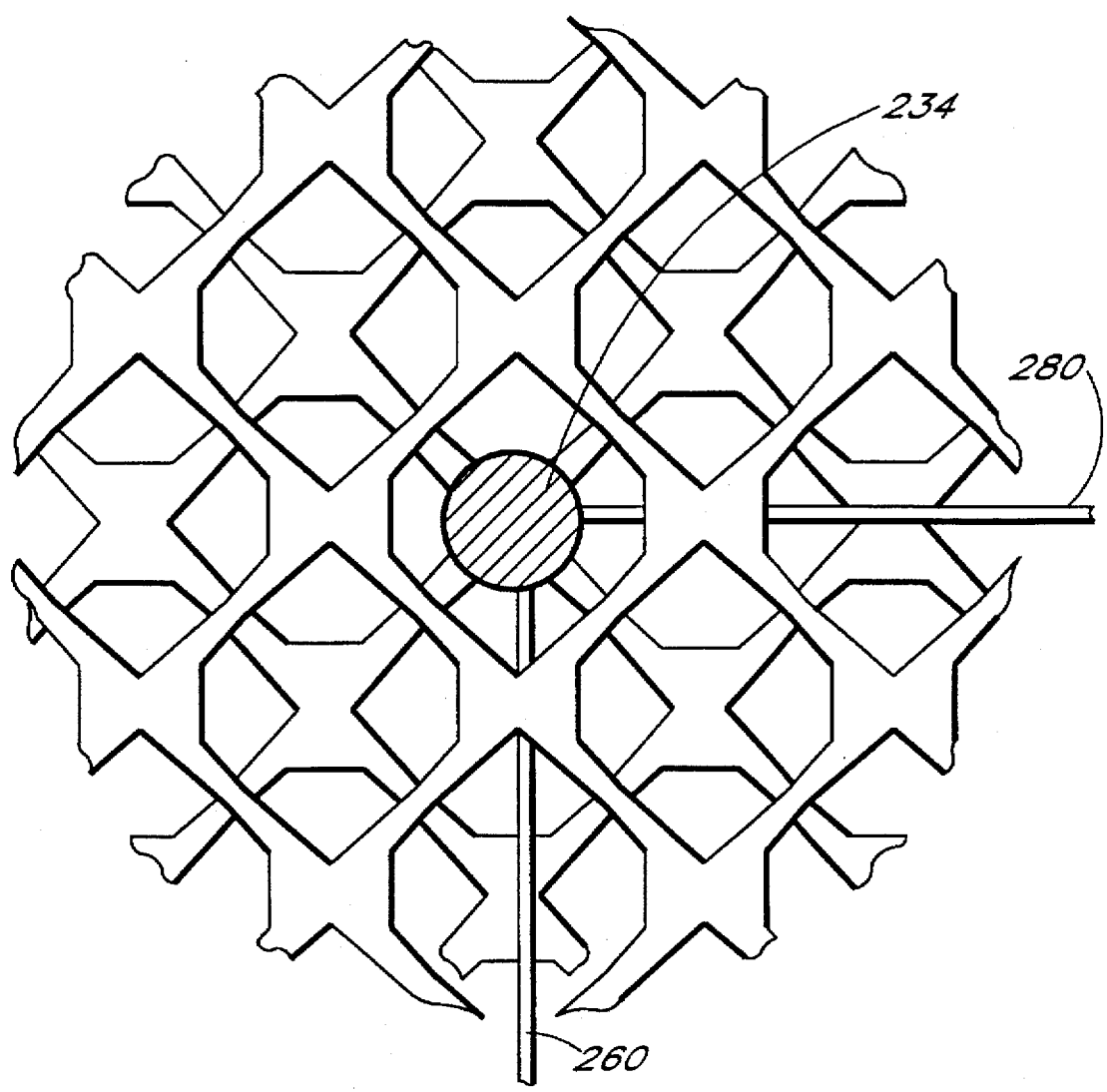
FIG. 11 depicts a plan view of a preferred method of executing a 90 degree turn in a signal conductor.

Occasionally, the signal conductors 260, 262, 264 or 280, 282, 284 have to be rerouted for a variety of reasons, such as, for example, to conform to design layouts or to make connections between ports that are not aligned along a line parallel to the Y axis. In such cases, the signal conductors 260, 262, 264 or 280, 282, 284 have to be reoriented to make such connections. As illustrated in FIG. 11, such changes in direction may be accomplished while keeping the impedance discontinuities of the signal conductors to a minimum. To accomplish a ninety-degree change in direction, the signal conductor 260 is first oriented in a direction parallel to the Y axis. A via (i.e., feed through hole) 234 is drilled through the circuit boards comprising the first signal conductor 260 and the second conductor 280. The second conductor 280 is oriented at 90 degrees with respect to the first conductor 260 and is oriented parallel to the X axis. The first conductor 260 is electrically connected to the second conductor 280 by means of the via 234, which is filled with solder, as known in the art. In this manner, signal conductors may be rerouted while keeping discontinuities to a minimum.

There also exists a need in the art to provide a printed circuit board or a cable with controlled, increased impedances for both stripline and microstrip signal conductors, wherein the signal conductors may be oriented parallel to either a first axis or a second axis, where the second axis is perpendicular to the first axis, without resorting to one of the traditional methods with their aforementioned attendant drawbacks, and without the need for conductor-to-grid alignment. These goals are met by a preferred embodiment of the invention discussed below.

Figure 3B:
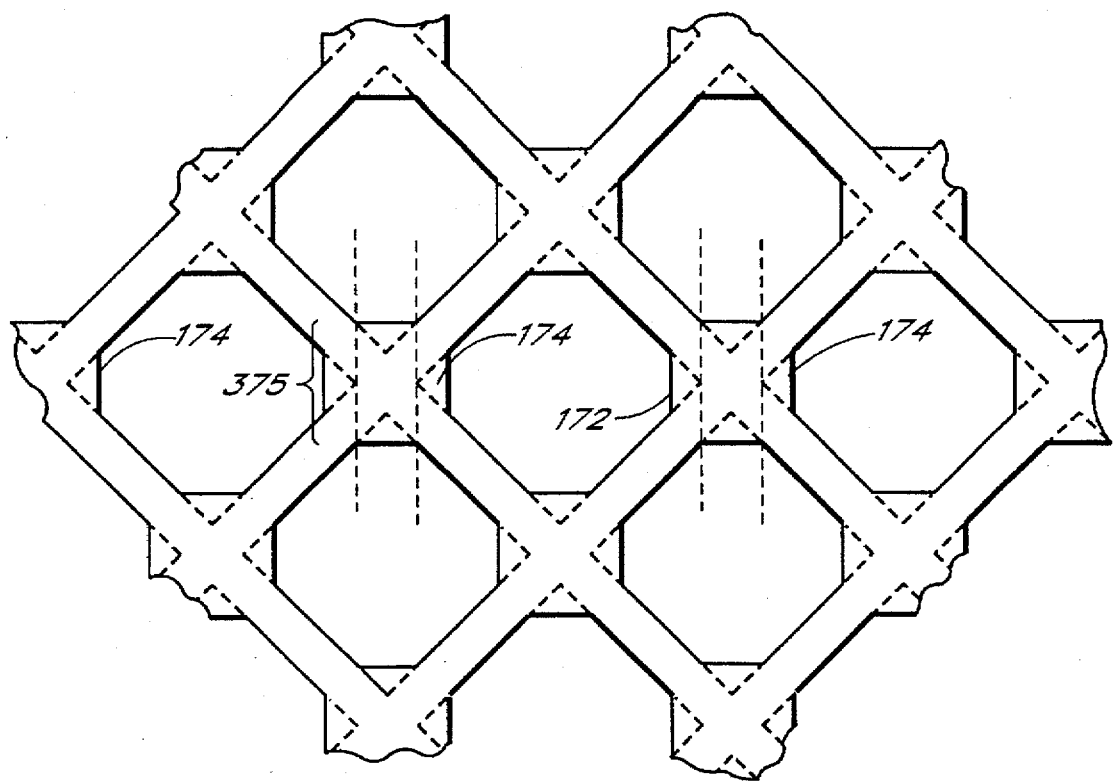
FIG. 3b depicts a second preferred embodiment of a cell structure in accordance with the present invention.
Figure 12:
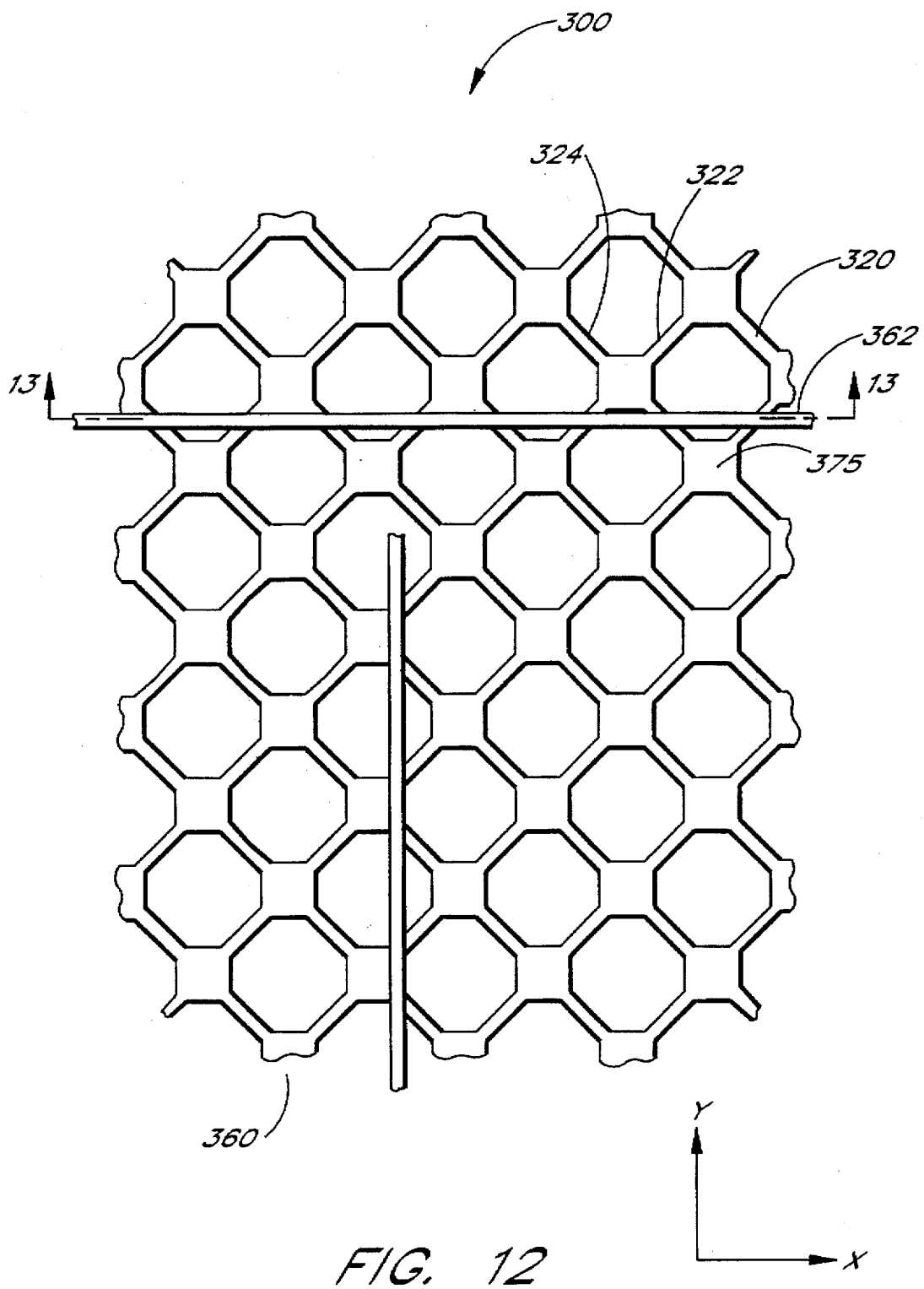
FIG. 12 depicts a plan view of a fourth preferred embodiment of circuit board transmission lines in accordance with the present invention.

FIG. 12 depicts a circuit board in accordance with a further aspect of the present invention. The circuit board comprises a conductive shielding grid 300, comprising a set of electrically conductive elements 322, 324 and a plurality of signal conductors 360, 362. As illustrated in FIG. 12, the shielding grid has a repeating pattern of cell structures. The cell structures are formed by electrically conductive elements 322, 324. The relative widths of the signal conductors 360, 362 and the conductive elements 322, 324 as depicted in FIG. 12 are shown by way of example only. In the preferred embodiment the cells are substantially the same as those in the three-layer preferred embodiment illustrated in FIG. 7, except the vertices 172, 174 are filled in with fillets forming shaped intersections 375, as depicted in FIG. 3b. It is understood that the cell configuration illustrated in FIGS. 3b, 12 is shown by way of example, and that numerous other suitable configurations may be used.

Figure 13:
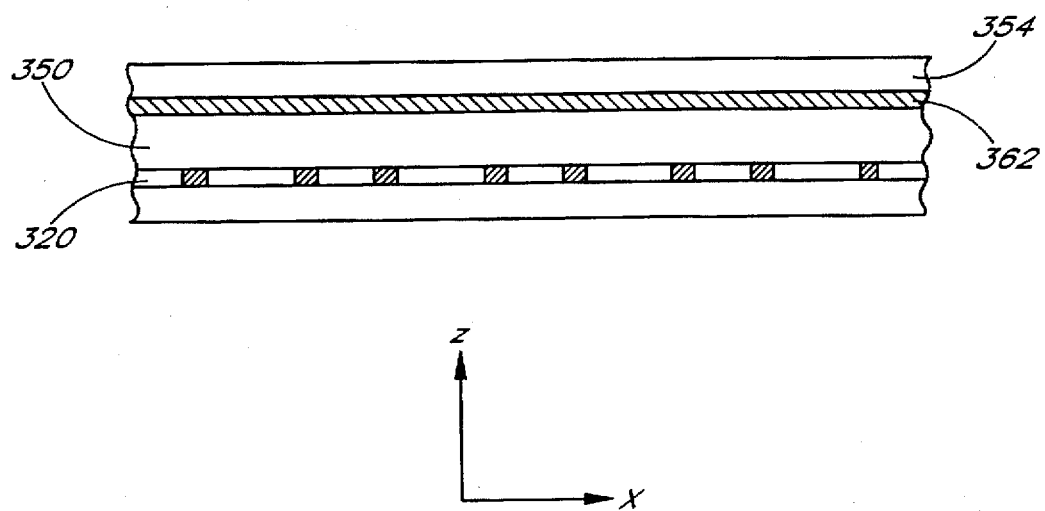
FIG. 13 depicts a cross sectional elevational view of one embodiment of the circuit board of the present invention taken along lines 13—13 of FIG. 12.

In order to more fully understand the following description, it is once again helpful to establish an X, Y, Z coordinate system for the drawing figures. The X and Y axes lie in a horizontal plane as shown in FIG. 12. The grid 320 is in a plane parallel to the horizontal plane. Similarly, the signal conductors 360, 362 lie in a plane substantially parallel to the plane of the grid 320. The principal orientation of the signal conductor 360 is substantially parallel to the Y axis while the principal orientation of the signal conductor 362 is substantially parallel to the X axis, as illustrated in FIGS. 12 and 13. The Z axis is perpendicular to the X and Y axes as shown in FIG. 13.

The signal conductors 360, 362 are electrically insulated from the grid 320 by an insulator 350. In the case of buried microstrip, the upper surface of the signal conductors 360, 362 are laminated with an insulator 354. The layers are sandwiched together and held in place by suitable adhesives known to the art.

As illustrated in FIG. 12, the conductive elements 322, 324 and intersections 375 are shaped such that the maximum variation of area traversed by a first signal conductor relative to any other signal conductor is minimized, whether the signal conductors are oriented parallel to the X axis or whether the signal conductors are oriented parallel to the Y axis. Thus, as will be appreciated by one skilled in the art, by minimizing the variation of area traversed by a first signal conductor relative to any other signal conductor the variation in impedance of the first signal conductor relative to any other signal conductor will likewise be minimized.

It will be understood by one skilled in the art that the present aspect of the invention can also be used in a three layer centered stripline embodiment, as well as in numerous other configurations.

Figure 14:
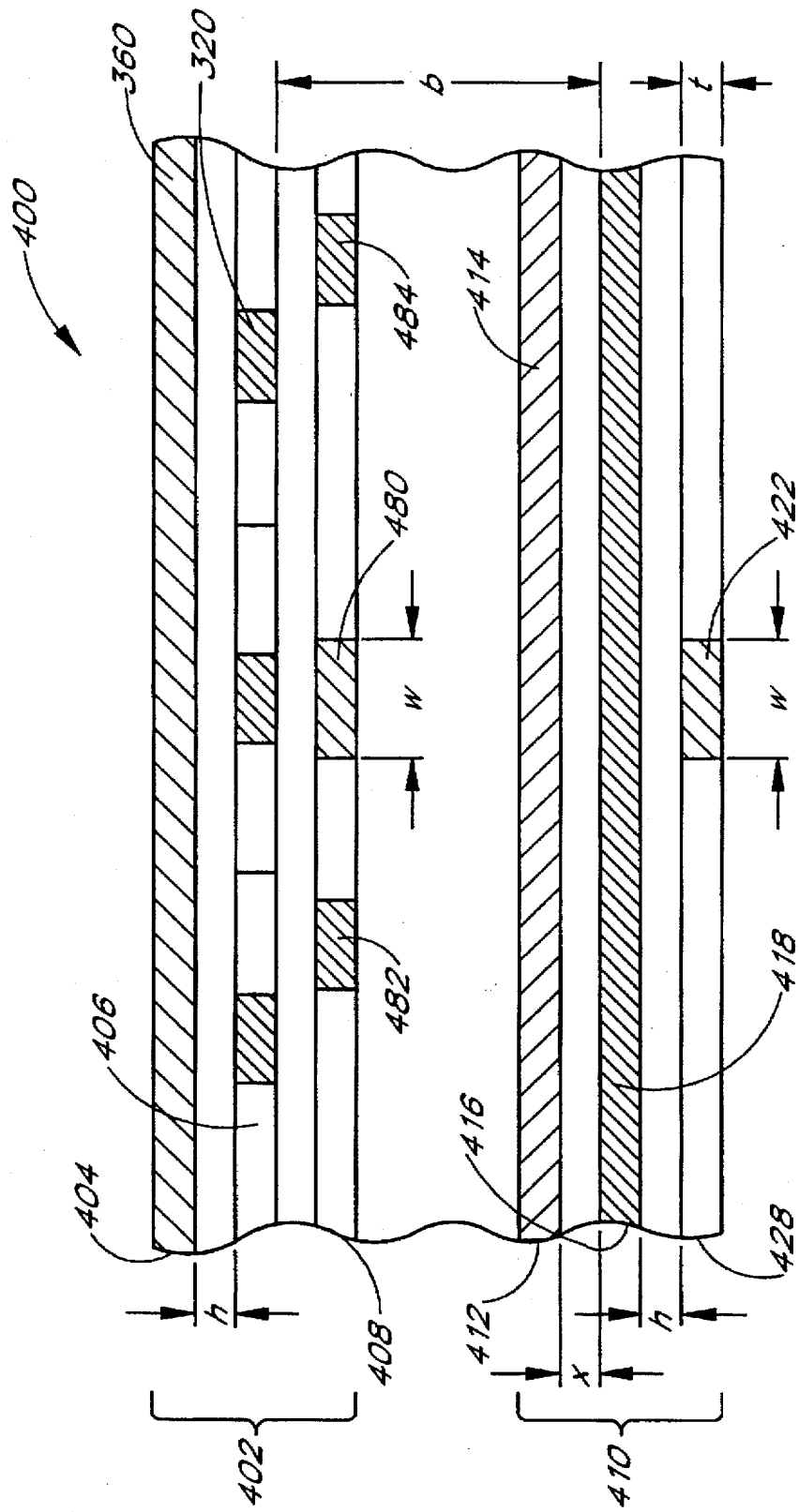
FIG. 14 depicts a cross sectional elevational view of one embodiment of the circuit board of the present invention.

FIG. 14 illustrates a cross-sectional view of the present invention implemented within a six-layer circuit board 400. The top three layers 402 in FIG. 14 comprise the upper signal conductor 360, the reference grid 320 and the lower signal conductors 480, 482, 484 of the present invention. The signal conductor 360 is located on the first layer 404; the reference grid 320 is located on the second layer 406; and the lower signal conductors 480, 482, 484 are located on the third layer 408. The lower three layers 410 represent the transmission lines and the reference planes of a conventional microstrip design. The first layer 412 of these three lower layers 410 comprises a first signal conductor 414. The second layer 416 of the three lower layers 410 comprises a solid reference plane 418. The third layer 428 comprises a second signal conductor 422. The layers 404, 406, 408, 412, 416 and 428 are electrically insulated from each other by insulators, are sandwiched together and are held in place by suitable adhesives known in the art.

The relationship between the characteristic impedance and the distance between the conductor and the reference plane for a conventional microstrip transmission line is illustrated by the equation:

$$Z_0 = \frac{119.9}{\sqrt{2(\epsilon_r + 1)}} \left[ \ln\left\{ 4\frac{h}{w} + \sqrt{16\left(\frac{h}{w}\right)^2 + 2} \right\} - \frac{1}{2}\left(\frac{\epsilon_r - 1}{\epsilon_r + 1}\right)\left(\ln\frac{\pi}{2} + \frac{1}{\epsilon_r}\ln\frac{4}{\pi}\right) \right] \quad (4)$$

where:

h is the separation between the surface conductor and the reference plane;

w is the width of the conductor; and $\epsilon_r$ is the dielectric constant of the material between the conductor and the reference plane.

The relationship between the characteristic impedance and the separation between the conductor and the reference planes for a conventional centered stripline is governed by the equation:

$$Z_0 = \frac{\eta_0}{2.0\pi\sqrt{\epsilon_r}} \ln\left\{ 1.0 + \frac{4.0(b-t)}{\pi w'}\left[\frac{8.0(b-t)}{\pi w'} + \sqrt{\left(\frac{8.0(b-t)}{\pi w'}\right)^2 + 6.27}\right]\right\} \Omega \quad (5)$$

where:

-continued $$w' = w + \frac{\Delta w}{t} t$$

$$\frac{\Delta w}{t} = \frac{1.0}{\pi} \ln\left[\frac{e}{\sqrt{\left(\frac{1}{2.0\frac{(b-t)}{t+1}}\right)^2 + \left(\frac{\frac{1}{4\pi}}{\frac{w}{t}+1.1}\right)^m}}\right]$$

$$m = \frac{6.0}{3.0 + \frac{2.0t}{(b-t)}}$$

b is the separation between the conductor and solid reference plane;

t is the thickness of the conductor; and $\eta_0$ is the characteristic impedance of free space (120π ohms).

Equations (4) and (5) provide more accurate representations of the relationship between the characteristic impedance and the separation between the conductors and the reference planes for the microstrip and stripline designs, respectively.

Conventionally, the impedance of circuit board transmission lines was increased by actually increasing the distance between the conductor and the reference planes. With reference to FIG. 14, Equation (4) and Equation (5), the increase in impedance obtained by increasing "h" for the microstrip layers and increasing "b" for stripline layers. As a result, all of the conductors on those layers would increase in impedance accordingly. If "ordinary" board impedances of 50 to 65 Ω are also required on the same plane as the high impedance layers, it would be necessary to increase the width (w) of the conductors to maintain the predominant 50 and 65 Ω impedances of the other signals on the board.

Unfortunately, the needed line width (w) would have to increase from the desired 4 or 5 mils to 27.3 and 16.4 mils respectively to maintain these impedances. These line widths will not fit between fine pitch device pads and, therefore, would have to be routed around integrated circuit chips. Furthermore, conductors of "ordinary" impedance that are routed from other layers onto the high impedance layer would need to have their widths adjusted from layer to layer to maintain matched impedance long their entire length. Even without the problems encountered with trying to route between fine pitch device pads, increasing "h" or "b" would result in approximately 2.7 times less signal density, since fewer signal conductors can be implemented on the same layer. Additionally, in a centered stripline environment, if high impedances on the order of 92 Ω are required using 5 mil lines, then the needed increase in "b" for a stripline conductor would result in a board thickness far exceeding the standard circuit board specification of 62 mils.

As discussed above, the present invention permits the construction of signal conductors, in selected areas, with a much wider range of impedances than in traditional design. This is done by the introduction of a new variable not considered in traditional microstrip and stripline designs, which has significant influence over the impedance of the conductor. This new variable is the percent copper used in the construction of the reference plane. Traditional references planes are solid. To increase the characteristic impedance conventionally, the separation between the signal conductor and the reference plane must be physically increased.

The present invention permits the increase of impedance without physically increasing the separation between signal conductors and the reference plane. Thus, impedance can be increased without increasing circuit board thickness. In addition, the impedance of signal conductors may be varied over a wide range by changing the percent copper used in the construction of the reference plane. The present invention also effectively eliminates the problems associated with traditional microstrip and stripline designs, and does not require signal conductor-to-grid alignment or signal conductor-to-signal conductor alignment, as discussed above.

While the present invention has the apparent effect of increasing the distance between the signal conductor and the reference plane, it has this effect only in the area where it is applied and it only affects the two signal layers immediately adjacent to the reference plane. Thus, the characteristics of the transmission lines in the rest of the circuit board are not changed. Thus, in FIG. 14, the signal conductors 360 and 480, 482, 484 in layers 404 and 408, respectively, will exhibit high impedance by virtue of the grid 320, while the signal conductors 414 and 422 in layers 412 and 428, respectively, will not be affected by the existence of the grid 320 and will operate at normal impedance.

A further advantage of the present invention is the virtual elimination of one source of crosstalk, namely forward crosstalk, from those signals routed under the grid 320. Crosstalk is the effect of coupling the signal of one channel into another. Crosstalk may arise from a number of sources, one of which is the unbalance of cable parameters—in particular, the capacitance and inductance between conductors. Due to this unbalance, net coupling of the signal of one conductor into another can result.

Such unbalance is generally aggravated when a conductor is exposed to nonhomogeneous media, as is the case with traditional microstrip construction. This is because forward crosstalk is the result of the difference between odd and even trace velocities, as known in the art. In a homogeneous medium, the odd and even trace velocities are equal and cancel each other out, resulting in the elimination of forward crosstalk. In nonhomogeneous media, these two velocities are unequal, resulting in a non-zero factor and giving rise to forward crosstalk. In traditional constructions which permit high impedances, such as microstrip construction, conductors interface with at least three different dielectrics, typically FR-4, solder mask and air. This nonhomogeneous environment results in differing even and odd trace velocities which result in forward crosstalk.

In the present invention, signals can be routed in a quasi-stripline or embedded-stripline environment through the signal conductors 480, 482, 484 below the grid 320, particularly when it is necessary to run signals via conductors parallel to each other for electrically long distances. "Electrically long" distances are distances approaching $\lambda/4$ where maximum coupling occurs. Because the conductors 480, 482, 484 on layer 408 are routed in a nearly homogenous environment, the difference in the odd and even trace velocities is nearly zero, and thus forward crosstalk approaches zero. As a result, the present invention virtually eliminates forward crosstalk.

In addition to the above described advantages, the present invention provides unprecedented shielding for the high impedance lines routed under the reference grid without the requirement of signal conductor-to-grid alignment or signal conductor-to-signal conductor alignment, as discussed above. Since the present design allows the routing of high impedance conductors on both layers 404 (microstrip or embedded microstrip) and 408 (stripline, or quasi-stripline) in FIG. 14, it is possible to route high impedance signals only through conductors on layer 408 on a typical six-layer board. In addition, if more high impedance conductors are desired, a gridded reference plane may be used on layer 416. The conductor 414 on layer 412 will then provide the required additional high impedance, while the grid on layer 416 will provide the necessary shielding.

Accordingly, the present invention allows the microstrip and stripline designer to select from a much wider range of impedances over traditional designs. This design is especially useful in providing very high impedance conductors in selected areas of a circuit board without increasing the thickness of standard circuit boards, without decreasing the width or thickness of signal conductors, and without resorting to the use of nonhomogeneous or nonstandard dielectrics. The present invention also provides high impedance while maintaining high signal density, and provides a significant level of shielding, while reducing crosstalk between high impedance conductors.

Although this invention has been described in terms of a certain preferred embodiment, other embodiments apparent to those of ordinary skill in the art are also within the scope of this invention. Accordingly, the scope of the invention is intended to be defined only by the claims which follow.

What is claimed is:

1. A high frequency circuit board, comprising:
   at least two signal conductors, said at least two signal conductors having like lengths and like widths; and
   a shielding grid having a pattern comprising a conductive material, said grid pattern configured whereby each of said at least two signal conductors is oriented parallel to a first axis and overlays a substantially constant area of the conductive material regardless of where each said signal conductor is positioned.

2. The circuit board as defined in claim 1, wherein said circuit board is flexible.

3. A circuit board capable of carrying high frequency signal lines, comprising:
   a first axis;
   a signal conductor;
   a first conductive grid having a first pattern comprising a first cell structure; and
   a second conductive grid substantially parallel to said first grid, and aligned at a predetermined offset with respect to said first grid, said first grid at least partially overlaid by said second grid, said second grid having a second pattern comprising a second cell structure, said signal conductor disposed between said first grid and said second grid and oriented parallel to said first axis, and said first and second cells configured to provide the signal conductor with a constant capacitance relative to the grids, regardless of where said signal conductor is positioned.

4. A circuit board as defined in claim 3, wherein said second pattern is substantially the same as said first pattern, and wherein said second cell structure is substantially the same as said first cell structure.

5. A shielding system, comprising:
   a first conductive grid in a first plane, having a first axis and a second axis, said second axis being perpendicular to said first axis in said first plane; and
   a signal conductor disposed in a second plane substantially parallel to said first plane, said signal conductor positioned in parallel to one of said first and said second axes, said signal conductor having a constant capacitance with said first conductive grid, regardless of where said signal conductor is located in said second plane.

6. A shielding system as defined in claim 5, further comprising a second conductive grid substantially parallel to said first conductive grid, said signal conductor being disposed between said first conductive grid and said second conductive grid, wherein the area of said first and said second conductive grids are varied to produce a constant capacitance relative to said signal conductor.

7. A high frequency circuit board, comprising:
   a shielding grid of conductive material having a first axis; and
   a signal conductor disposed at a relatively constant distance from said shielding grid and parallel to said first axis, said shielding grid configured such that said signal conductor traverses a substantially constant area of said conductive material regardless of where said conductor is positioned with respect to said shielding grid.

8. The circuit board as defined in claim 7, wherein said circuit board is flexible.

9. A circuit board capable of carrying high speed signals, comprising:
   a shield grid of conductive material in a plane having a first axis and having a second axis perpendicular to said first axis, a signal conductor positioned parallel to said first axis, said shield grid having a structure which provides said signal conductor with a constant capacitance relative to said shield grid regardless of where said signal conductor is positioned along said second axis.

10. A circuit board as defined in claim 9, further comprising a second shield grid of conductive material aligned at a predetermined offset from said first shield grid in said first axis, said second shield grid positioned at a predetermined offset from said first shield grid in a third axis, said third axis being orthogonal to said first and said second axes, said signal conductor disposed between said first and said second shield grids, wherein an area of the conductive material of said first shield grid and an area of said conductive material of said second shield grid are reduced where said first shield grid and said second shield grid overlap in said third axis to produce a constant impedance in said signal conductor when said signal conductor is positioned proximate to said overlap.

11. A method of increasing the impedance of a signal conductor in a circuit board, comprising the steps of:
   (a) positioning in a first plane a first patterned shielding grid having a first axis on one side of a signal conductor, said signal conductor located in a second plane, said patterned shielding grid comprising a plurality of intersections of conductive elements;
   (b) positioning said signal conductor so that it is parallel to said first axis;
   (c) configuring said conductive elements and said intersections so that an average capacitance formed with said signal conductor remains constant regardless of the positioning of said signal conductor along a second axis.

12. A method as described in claim 11, further comprising the steps of:
   (d) positioning a second patterned shielding grid in a third plane on an opposite side of said signal conductor, said second grid being offset from said first grid in said first axis, and said third plane parallel to said first plane; and
   (e) configuring said first grid and said second grid so that said capacitance remains constant.

13. A circuit board configured to carry high frequency signals, comprising:
   a first axis;
   a first signal conductor and a second signal conductor oriented parallel to said first axis; and
   a shielding grid, said shielding grid comprising:
      a first set of conductive elements in a first plane disposed at a distance from said first and second signal conductors;
      a second set of conductive elements disposed in said first plane and perpendicular to said first set of conductive elements so that said first set of conductive elements and said second set of conductive elements form a repeating pattern of cells, each of said cells having a first and second vertex, said first vertex being diagonally opposed to said second vertex, said first vertex and said second vertex each having a conductive fillet disposed therein, each of said signal conductors overlaying a substantially constant area of said conductive elements and fillets.

14. A circuit board as defined in claim 13, wherein each of said cells have a third and a fourth vertex, said third vertex and said fourth vertex each having a conductive fillet disposed therein.

15. A circuit board as defined in claim 14, further comprising a third signal conductor oriented perpendicular to said first axis.

16. A circuit board capable of carrying high speed signals, comprising:
   a signal conductor;
   a shield grid in a first plane, said signal conductor positioned parallel to said shield grid in a second plane, said shield grid comprising a conductive material which forms a repeating pattern of eye-shaped openings which causes said signal conductor to overlie a substantially constant area of said shield grid to provide a constant impedance regardless of where said signal conductor is positioned with respect to said shield grid.

17. A shielding grid in a first plane which provides a controlled impedance for a signal line positioned in a second plane, said first plane parallel to said second plane, said shielding grid comprising:
   a first set of conductive elements disposed in said first plane;
   a second set of conductive elements disposed in said first plane, wherein said first set of conductive elements intersects said second set of conductive elements to thereby form a repeating patterns of cells, each of said cells having a first and second vertex, said first vertex being diagonally opposed to said second vertex, said first vertex and said second vertex each having a conductive fillet disposed therein.

18. A circuit board capable of carrying high speed signals, comprising:
   a signal conductor;
   a shield grid in a first plane, said shield grid comprising a conductive material which forms a repeating pattern of shaped openings in a direction of a first axis, said signal conductor positioned parallel to said shield grid in a second plane parallel to said first plane and overlaying a substantially constant area of said conductive material regardless of where said signal conductor is positioned in said second plane along a second axis perpendicular to said first axis.

* * * * *